United States Patent [19]
Tanitsu

[11] Patent Number: 5,955,243
[45] Date of Patent: Sep. 21, 1999

[54] ILLUMINATION OPTICAL SYSTEM AND METHOD OF MANUFACTURING SEMICONDUCTOR DEVICES

[75] Inventor: Osamu Tanitsu, Funabashi, Japan

[73] Assignee: Nikon Corporation, Tokyo, Japan

[21] Appl. No.: 09/008,596

[22] Filed: Jan. 16, 1998

[30] Foreign Application Priority Data

Jan. 16, 1997 [JP] Japan .................................. 9-019912

[51] Int. Cl.$^6$ .............................. G03F 7/20; G02B 27/09; H01L 21/027
[52] U.S. Cl. ...................... 430/311; 430/396; 359/744; 359/784; 359/791; 355/50; 355/53; 355/67; 355/77
[58] Field of Search .................................. 359/744, 784, 359/791; 430/311, 396; 355/50, 53, 67, 77

[56] References Cited

U.S. PATENT DOCUMENTS 5,245,384  9/1993  Mori .......................................... 355/67
5,724,122  3/1998  Oskotsky .................................. 355/67

FOREIGN PATENT DOCUMENTS 1-96929   4/1989  Japan .
9-033852  2/1997  Japan .

*Primary Examiner*—John A. McPherson
*Attorney, Agent, or Firm*—Morgan, Lewis & Bockius LLP

[57] ABSTRACT

An illumination optical system having an afocal optical system includes a first group of lenses having negative refracting power, a second group of lenses having positive refracting power and being positioned further away from a light source than the first group of lenses, and a third group of lenses having positive refracting power and being positioned further away from the light source than the second group of lenses, wherein the afocal optical system expands a parallel beam of light emitted from the light source or converts the parallel beam of light into a parallel beam having equivalent magnification.

35 Claims, 4 Drawing Sheets

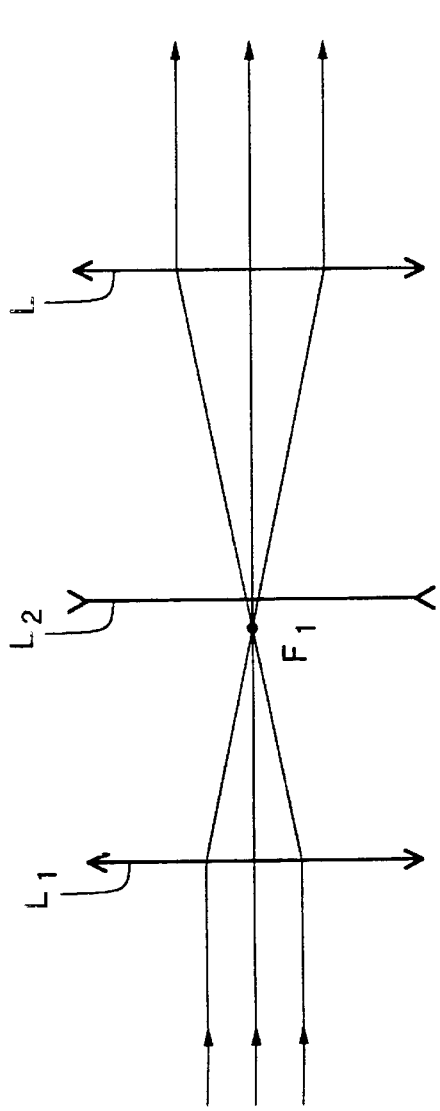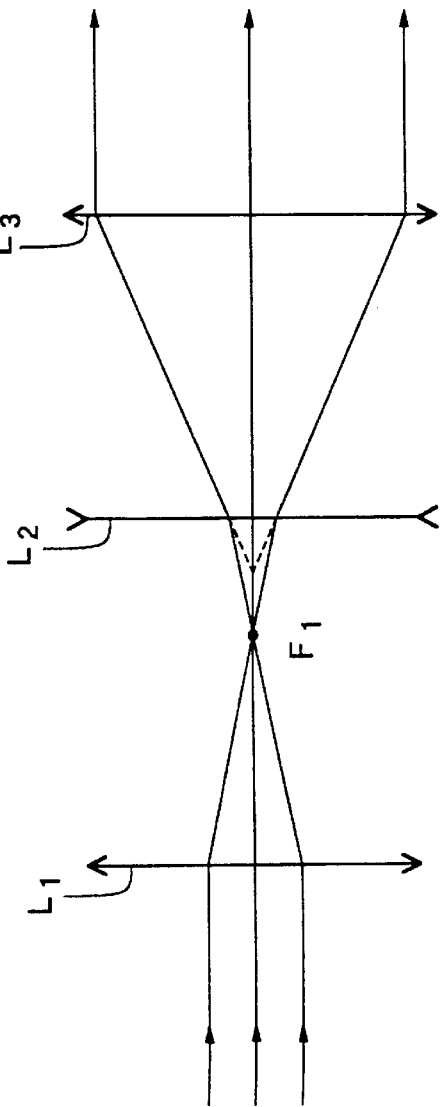
FIG. 4(a)
FIG. 4(b)

ILLUMINATION OPTICAL SYSTEM AND METHOD OF MANUFACTURING SEMICONDUCTOR DEVICES

This application claims the benefit of Japanese patent application No. 09-019912, filed Jan. 16, 1997, which is hereby incorporated by reference.

BACKGROUND OF THE INVENTION

1. Field of the Present Invention

The present invention relates to an illumination optical system employing an excimer laser as a light source and using a beam expander to magnify or reshape a laser beam from the excimer laser, and more particularly, to an illumination optical system used for semiconductor device manufacturing equipment, and a semiconductor device manufacturing method using the illumination optical system.

2. Discussion of the Related Art

In recent years, semiconductor circuit patterns have been decreasing in size in the manufacture of semiconductors or semiconductor chip-mounted boards. Accordingly, semiconductor device manufacturing equipment used to print these circuit patterns has been required to exhibit an ever-higher resolution. In addition, illumination optical systems employing excimer lasers as light sources that generate high output ultraviolet beams at shorter wavelengths have replaced mercury lamps, which were conventionally used as ultraviolet beam sources. These optical systems have been developed for transferring circuit patterns onto a wafer by photolithographic exposure. An illumination optical system that uses the excimer laser as a light source is an afocal optical system that includes a first group of lenses with positive refracting power, a second group of lenses with negative refracting power, and a third group of lenses with positive refracting power, arranged in that order from a light source. Such a conventional system is disclosed in a Japanese Patent Laid-Open Publication No. 01-96929. An illumination optical system using an afocal optical system that includes a first group of lenses with positive refracting power, a second group of lenses with positive refracting power, and a third group of lenses with positive refracting power, arranged in that order from a light source, is also known.

FIGS. 4(a) and 4(b) are schematic diagrams of an afocal optical system used in a conventional illumination optical system. FIG. 4(a) represents a schematic diagram at a relatively low magnification, and FIG. 4(b) represents a schematic diagram at a relatively high magnification. The afocal optical system of this conventional example comprises a first group of lenses $L_1$ with positive refracting power, a second group of lenses $L_2$ with negative refracting power, and a third group of lenses $L_3$ with positive refracting power, arranged in that order from a light source. A parallel laser beam from the excimer laser, not shown in FIGS. 4(a) or 4(b), enters the first group of lenses $L_1$ from the left side of the drawings and is focused at a focal point $F_1$ by the first group of lenses $L_1$, since the first group of lenses $L_1$ exhibits positive refracting power. The laser beam then enters the second group of lenses $L_2$, located in the vicinity of the focal point $F_1$ after the first group of lenses $L_1$. The beam emitted is then converted into a parallel beam again by the third group of lenses $L_3$.

The afocal optical system used in the conventional illumination optical system has an advantage in that magnification can be changed significantly by slightly moving the second group of lenses $L_2$, since the second group of lenses $L_2$ is located in the vicinity of the focal point $F_1$ after the first group of lenses $L_1$. At the same time, however, a focus point exists near the neighborhood of the second group of lenses $L_2$, which causes impurities in the atmosphere to accumulate on lens surfaces, thereby reducing the transmissivity of the lenses and heating the lenses, ultimately deteriorating lens material life drastically. In some cases, the lenses may actually break.

SUMMARY OF THE INVENTION

Accordingly, the present invention is directed to an illumination optical system and method of manufacturing semiconductor devices, and a semiconductor device manufacturing method using the illumination optical system that substantially obviates one or more of the problems due to the limitations and disadvantages of the related art.

Accordingly, one object of the present invention is to provide an illumination optical system wherein lens life is extended.

Another object of the present invention is to provide an illumination optical system capable of changing a cross-section of an incident light beam.

Another object of the present invention is to provide an illumination optical system that can change a magnification of a constituent afocal optical system by adjusting distances between lenses along an optical axis of the illumination optical system.

Additional features and advantages of the present invention will be set forth in the description which follows, and will be apparent from the description, or may be learned by practice of the invention. The objectives and other advantages of the invention will be realized and attained by the structure and process particularly pointed out in the written description as well as in the appended claims.

To achieve these and other advantages and in accordance with the purpose of the present invention, as embodied and broadly described, in accordance with a first aspect of the present invention there is provided an illumination optical system having an afocal optical system including a first group of lenses having negative refracting power, a second group of lenses having positive refracting power and being positioned further away from a light source than the first group of lenses, and a third group of lenses having positive refracting power and being positioned further away from the light source than the second group of lenses, wherein the afocal optical system expands a parallel beam of light emitted from the light source or converts the parallel beam of light into a parallel beam having equivalent magnification.

In another aspect of the present invention there is provided an illumination optical system having an afocal optical system including a first group of lenses having positive refracting power, a second group of lenses having positive refracting power and being positioned further away from a light source than the first group of lenses, and a third group of lenses having negative refracting power and being positioned further away from the light source than the second group of lenses, wherein the afocal optical system amplifies a parallel beam of light emitted from the light source or converts the parallel beam of light into a parallel beam having equivalent magnification.

In another aspect of the present invention, there is provided a method of manufacturing a semiconductor device comprising the steps of illuminating a reticle by means of an illumination optical system having an afocal optical system comprising a first group of lenses having negative refracting power, a second group of lenses having positive refracting power and being positioned further away from a light source than the first group of lenses, and a third group of lenses having positive refracting power and being positioned further away from the light source than the second group of lenses, wherein the afocal optical system amplifies a parallel beam of light emitted from the light source or converts the parallel beam of light into a parallel beam having equivalent magnification, and imaging a pattern from the reticle onto a wafer.

In another aspect of the present invention, there is provided a method for manufacturing a semiconductor device, including the steps of illuminating a reticle with an illumination optical system having an afocal optical system comprising a first group of lenses having positive refracting power, a second group of lenses having positive refracting power and positioned further away from a light source than the first group of lenses, and a third group of lenses having negative refracting power and positioned further away from the light source than the second group of lenses, wherein the afocal optical system expands a parallel beam of light emitted from the light source or converts the parallel beam of light into a parallel beam of light having equivalent magnification, and forming a pattern corresponding to the reticle on a photosensitive substrate.

In another aspect of the present invention, there is provided an illumination optical system, including a light source emitting a first beam of light, and a beam reshaping optical system for converting the beam of light into a second beam of light having a first cross-sectional area, wherein the beam reshaping optical system comprises a plurality of groups of lenses arranged to form the second beam, wherein each of the plurality of groups of lenses is positioned in a beam of light having a cross-sectional area larger than the first cross-sectional area.

In another aspect of the present invention, there is provided a method for manufacturing a semiconductor device by using an illumination optical system having a light source emitting a first beam of light having a first cross-sectional area, and a beam reshaping optical system for converting the first beam of light into a second beam of light having a second cross-sectional area, wherein the beam reshaping optical system includes a plurality of groups of lenses arranged to form the second beam, and wherein each of the plurality of groups of lenses is positioned in a beam of light having a cross-sectional area larger than the first cross-sectional area, including the steps of illuminating a reticle having a predetermined pattern with the second beam of light from the illumination optical system, and exposing the predetermined pattern onto a photosensitive substrate.

In another aspect of the present invention, there is provided a method for manufacturing a semiconductor device by using an illumination optical system having a light source emitting a first beam of light having a first cross-sectional area, a beam reshaping optical system for converting the first beam of light into a second beam of light having a second cross-sectional area, and a projection optical system positioned between a reticle and a photosensitive substrate, wherein the beam reshaping optical system includes a plurality of groups of lenses arranged to form the second beam, and wherein each of the plurality of groups of lenses is positioned in a beam of light having a cross-sectional area larger than the first cross-sectional area, including the steps of illuminating a reticle having a predetermined pattern with the second beam of light from the illumination optical system, and exposing the predetermined pattern onto a photosensitive substrate through a projection optical system.

In another aspect of the present invention, there is provided a method for manufacturing a semiconductor device by using an illumination optical system having a light source emitting a first beam of light having a first cross-sectional area, and a beam reshaping optical system for converting the first beam of light into a second beam of light having a second cross-sectional area, wherein the beam reshaping optical system includes a plurality of groups of lenses arranged to form the second beam, wherein at least one of the plurality of groups of lenses is movable along an optical axis of the beam reshaping optical system to make a magnification of the beam reshaping optical system variable and is positioned in a beam of light having a cross-sectional area larger than the first cross-sectional area of the first beam of light entering the beam reshaping optical system while the magnification of the beam reshaping optical system is varied, including the steps of illuminating a reticle having a predetermined pattern with the second beam of light from the illumination optical system, and exposing the predetermined pattern onto a photosensitive substrate.

In another aspect of the present invention, there is provided a method for manufacturing a semiconductor device by using an illumination optical system having a light source emitting a first beam of light having a first cross-sectional area, and a beam reshaping optical system for converting the first beam of light into a second beam of light having a second cross-sectional area, wherein the beam reshaping optical system includes a plurality of groups of lenses arranged to form the second beam, wherein at least one of the plurality of groups of lenses is movable along an optical axis of the beam reshaping optical system to make a magnification of the beam reshaping optical system variable and is positioned in a beam of light having a cross-sectional area larger than the first cross-sectional area of the first beam of light entering the beam reshaping optical system while the magnification of the beam reshaping optical system is varied, wherein a projection optical system is positioned between a reticle and a photosensitive substrate, and wherein the reticle is illuminated by the second beam of light, including the steps of illuminating a reticle having a predetermined pattern with the second beam of light from the illumination optical system, and exposing the predetermined pattern onto a photosensitive substrate through the projection optical system.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention that together with the description serve to explain the principles of the invention.

In the drawings:

FIGS. 1(a) and 1(b) are schematic diagrams illustrating a portion of an embodiment of an illumination optical system of the present invention;

FIGS. 2(a) and 2(b) are schematic diagrams illustrating a portion of another embodiment of an illumination optical system of the present invention;

FIG. 3(a) illustrates a plane cross-section and FIG. 3(b) illustrates a longitudinal section of an exposure system to achieve the semiconductor device manufacturing method of the present invention; and FIGS. 4(a) and 4(b) are schematic diagrams illustrating an afocal optical system used for a conventional illumination optical system.

DETAILED DESCRIPTION OF THE PREFERRED EMBODIMENTS

Reference will now be made in detail to the preferred embodiments of the present invention, examples of which are illustrated in the accompanying drawings.

Figures 1A, 1B:
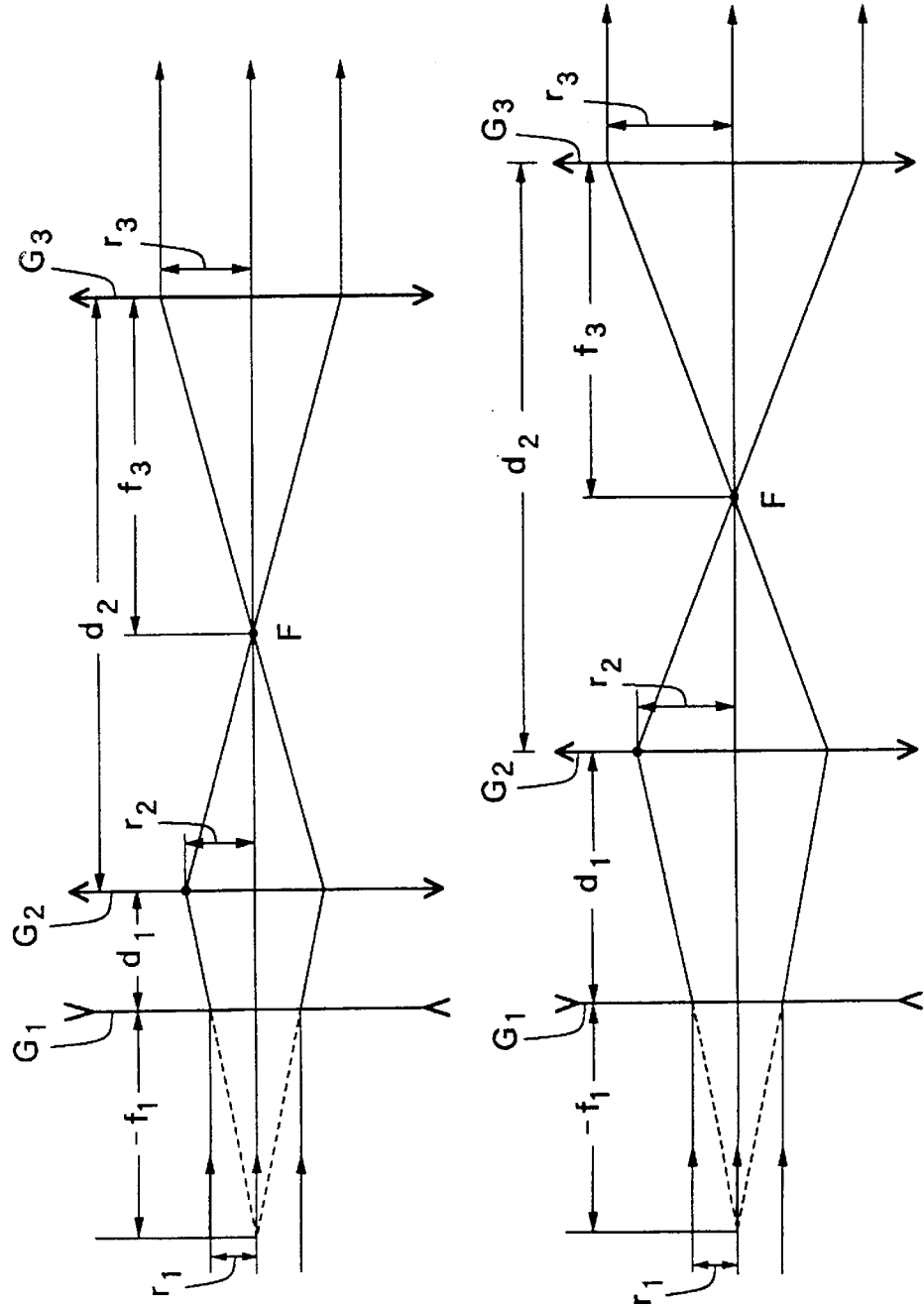

FIGS. 1(a) and 1(b) show an embodiment of an afocal optical system of an illumination optical system of the present invention. FIG. 1(a) represents a schematic diagram at a relatively low magnification, and FIG. 1(b) represents a schematic diagram at a relatively high magnification.

The afocal optical system of the first embodiment of the present invention includes a first group of lenses with negative refracting power $G_1$, a second group of lenses with positive refracting power $G_2$, and a third group of lenses with positive refracting power $G_3$, arranged in that order from a light source. References $f_1$, $f_2$, and $f_3$ denote the focal distances of the first group of lenses $G_1$, the second group of lenses $G_2$, and the third group of lenses $G_3$, respectively. References $d_1$ and $d_2$ denote the distance between the first group of lenses $G_1$ and the second group of lenses $G_2$ and the distance between the second group of lenses $G_2$ and the third group of lenses $G_3$, respectively. A parallel laser beam from an excimer laser (not shown in the FIGs.) enters the first group of lenses $G_1$ at a radius $r_1$ from the left side of the drawings. This parallel laser beam enters the second group of lenses $G_2$ as a divergent beam, since the first group of lenses $G_1$ has negative refracting power. This divergent beam is then focused into a convergent beam, since the second group of lenses $G_2$ has positive refracting power. The convergent beam then enters the third group of lenses $G_3$ with positive refracting power. By making a focal point F before the third group of lenses $G_3$ coincide with the converging point attributable to the second group of lenses $G_2$, however, the laser beam coming from the third group of lenses $G_3$ is converted back into a parallel beam of light at radius $r_3$.

For this optical system to function as a Keplerian afocal beam expander, a composite focal distance of the first group of lenses $G_1$ and the second group of lenses $G_2$ must have a positive value, and the focal distance $f_3$ of the third group of lenses $G_3$ must be greater than the composite focal distance of the first group of lenses $G_1$ and the second group of lenses $G_2$. As a result, a radius $r_2$ of the laser beam entering the second group of lenses $G_2$ and a radius $r_3$ of the laser beam coming from the third group of lenses $G_3$ must be greater than a radius $r_1$ of the beam entering the first group of lenses $G_1$. In other words, the energy densities of the laser beams entering the second group of lenses $G_2$ and the third group of lenses $G_3$ become lower than the energy density of the laser beam entering the first group of lenses $G_1$. Since damage to lens material is proportional to incident energy density, lower energy density inhibits the damage to the lens material, increasing the time until damage to the lens material occurs, and ultimately extending lens life.

When a group of lenses consists of thin lenses, the energy density of the laser beam for the laser material is explained below with reference to FIGS. 1(a) and 1(b). If the beam radius is $r_1$ for a circular laser beam entering the first group of lenses $G_1$, the beam radius $r_2$ of a beam entering the second group of lenses $G_2$ is:

$$r_2 = \frac{(|f_1| + d_1) \cdot r_1}{|f_1|}$$

Since $d_1 \geq 0$, $r_2 \geq r_1$. On the other hand, where r denotes beam radius (of a roughly circular laser beam), energy density E [Joules/m$^2$] of energy P [Joules] of an incident laser beam is:

$$E = \frac{P}{\pi r^2}$$

Accordingly, if $E_1$ and $E_2$ denote the energy densities at the first group of lenses $G_1$ and the second group of lenses $G_2$, respectively, then $E_1 \geq E_2$.

In addition, as to the energy density for the third group of lenses $G_3$, $E_3 \geq E_1$, since $r_3 \geq r_1$ if the afocal beam expander's magnification $\beta = |r_3/r_1|$ is no less than an equivalent magnification. Therefore, since the afocal beam expander of this embodiment does not have any lens material that exhibits an energy density greater than the incident energy density, the lens material undergoes minimal deterioration or damage, thereby extending lens life.

The conditions for the optical system of this embodiment to function as a Keplerian afocal beam expander are shown below. In the optical system of FIGS. 1(a) and 1(b), imaging of the second group of lenses $G_2$ is expressed as follows:

$$\frac{1}{d_1 - f_1} + \frac{1}{d_2 - f_3} = \frac{1}{f_2} \tag{1}$$

Accordingly, $d_1$ is expressed as follows:

$$d_1 = f_1 + f_2 + f_2 \cdot \left(\frac{d_1 - f_1}{d_2 - f_3}\right) \tag{2}$$

Similarly, $d_2$ is expressed as follows:

$$d_2 = f_2 + f_3 + f_2\left(\frac{d_2 - f_3}{d_1 - f_1}\right) \tag{3}$$

On the other hand, magnification $\beta = |r_3/r_1|$ of the afocal beam expander of this embodiment is expressed as follows:

$$\beta = \left|\frac{r_3}{r_1}\right| = \left|\frac{r_2}{r_1} \cdot \frac{r_3}{r_2}\right| = -\frac{d_1 - f_1}{f_1} \cdot \frac{f_3}{d_2 - f_3} = -\frac{(d_1 - f_1)f_3}{(d_2 - f_3)} \cdot f_1 \tag{4}$$

Accordingly, $d_1$ and $d_2$ can be expressed using $f_1$, $f_2$, $f_3$, and $\beta$ as follows:

$$d_1 = f_1 + f_2 - \frac{f_1 f_2}{f_3}\beta \tag{5}$$

$$d_2 = f_2 + f_3 - \frac{f_2 f_3}{f_1 \beta} \tag{6}$$

Thus, it is possible to construct an afocal beam expander that can adjust the magnification $\beta$ continuously as required by varying $d_1$ and $d_2$ to satisfy equations (5) and (6) above.

When changing the magnification of the afocal beam expander, it is preferable to move the second group of lenses $G_2$ and the third group of lenses $G_3$ along the optical axis, with the first group of lenses $G_1$ fixed, so as to vary the distance $d_1$ between the first group of lenses $G_1$ and the second group of lenses $G_2$ and the distance $d_2$ between the second group of lenses $G_2$ and the third group of lenses $G_3$.

Also, if the first group of lenses $G_1$, the second group of lenses $G_2$, and the third group of lenses $G_3$ include thick lenses or a plurality of lenses, the following expressions apply:

$$d_1 = D_1 + S_{1r} + S_{2f} \quad (7)$$

$$d_2 = D_2 + S_{2r} + S_{3f} \quad (8)$$

where $D_1$ is the distance from the final lens surface of the first group of lenses $G_1$ to the first lens surface of the second group of lenses $G_2$; $D_2$ is the distance from the final lens surface of the second group of lenses $G_2$ to the first lens surface of the third group of lenses $G_3$; $S_{1r}$ is the distance from the rear-side principal plane to the final lens surface in the first group of lenses $G_1$; $S_{2f}$ is the distance from the first lens surface to the front-side principal plane in the second group of lenses $G_2$; $S_{2r}$ is the distance from the rear-side principal plane to the final lens surface in the second group of lenses $G_2$; and $S_{3r}$ is the distance from the first lens surface to the front-side principal plane in the third group of lenses $G_3$.

If the first group of lenses $G_1$, the second group of lenses $G_2$, and the third group of lenses $G_3$ include thick lenses or a plurality of lenses, substituting the expressions (7) and (8) in the expressions (5) and (6), respectively, results in the following expressions, where $D_1$ and $D_2$ are expressed using $f_1$, $f_2$, $f_3$, and $\beta$, to result in:

$$D_1 + S_{1r} + S_{2f} = f_1 + f_2 - \frac{f_1 f_2}{f_3}\beta \quad (9)$$

$$D_2 + S_{2r} + S_{3f} = f_2 + f_3 - \frac{f_2 f_3}{f_1}\beta \quad (10)$$

Figure 2A:
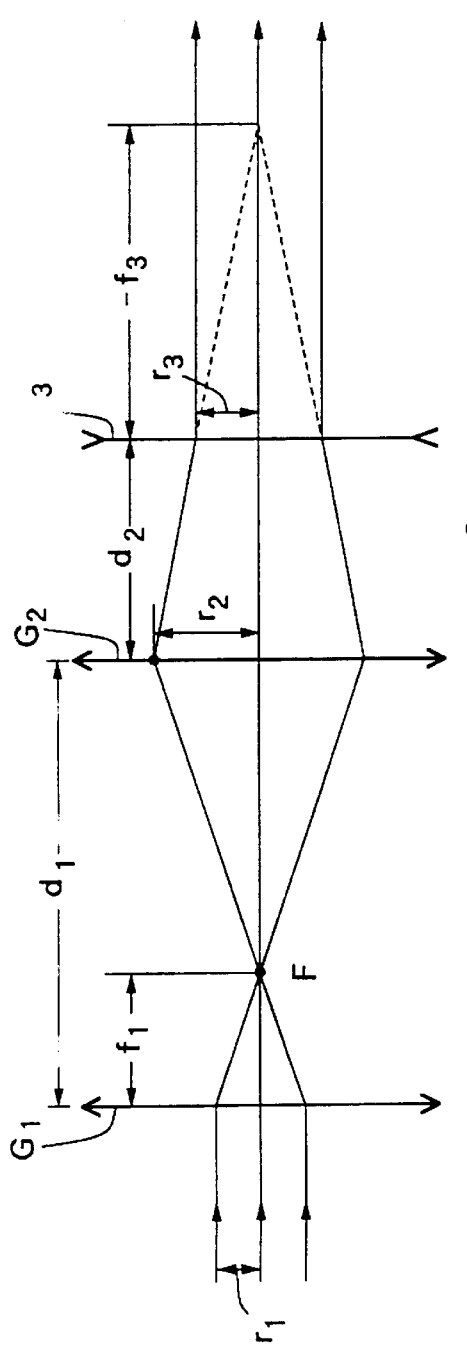
Figure 2B:
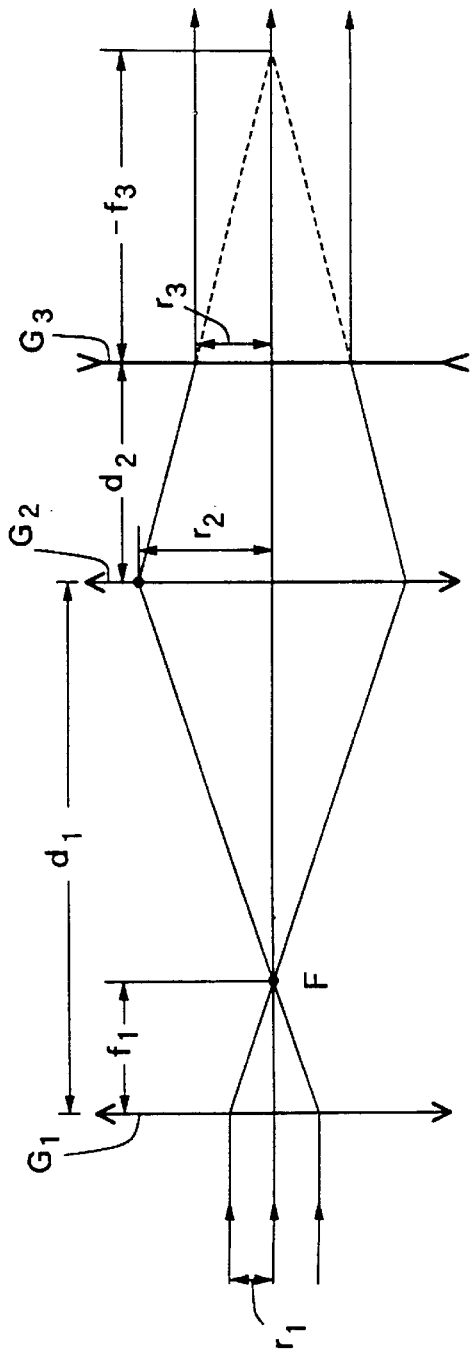

FIGS. 2(a) and 2(b) show another embodiment of an afocal optical system used in the illumination optical system of the present invention. FIG. 2(a) represents a schematic diagram at a relatively low magnification, and FIG. 2(b) represents a schematic diagram at a relatively high magnification.

The afocal optical system of this embodiment includes a first group of lenses with positive refracting power $G_1$, a second group of lenses with positive refracting power $G_2$, and a third group of lenses with negative refracting power $G_3$, arranged in that order from a light source. As with the first embodiment, $f_1$, $f_2$, and $f_3$ denote the focal distances of the first group of lenses $G_1$, the second group of lenses $G_2$, and the third group of lenses $G_3$, respectively; $d_1$ and $d_2$ denote the distance between the first group of lenses $G_1$ and the second group of lenses $G_2$ and the distance between the second group of lenses $G_2$ and the third group of lenses $G_3$, respectively.

The same relational expressions that apply to the afocal optical system of the first embodiment apply to the second embodiment. Accordingly, it is possible to construct an afocal beam expander that can change the magnification $\beta$ continuously by varying $d_1$ and $d_2$ as to meet the expressions (5) and (6) or the expressions (9) and (10).

When changing the magnification of the afocal beam expander, it is preferable to move the second group of lenses $G_2$ and the third group of lenses $G_3$ along the optical axis, with the first group of lenses $G_1$ fixed, so as to vary the distance $d_1$ between the first group of lenses $G_1$ and the second group of lenses $G_2$ and the distance $d_2$ between the second group of lenses $G_2$ and the third group of lenses $G_3$.

In the first and second embodiments as shown in FIGS. 1(a), 1(b), 2(a) and 2(b), a cross-section of a laser beam entering the afocal beam expander can be changed to a predetermined size. Therefore, even though different laser sources may have different beam diameters that enter the afocal beam expander, the diameter of the beam after exiting the afocal beam expander can remain fixed by changing the magnification of the afocal beam expander.

Figure 3A:
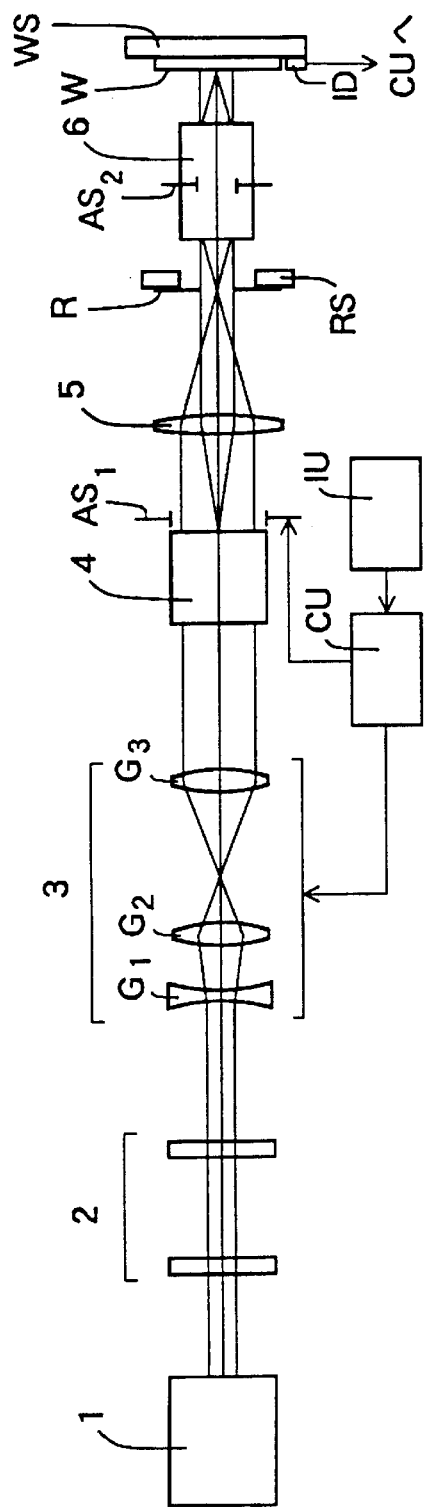
Figure 3B:
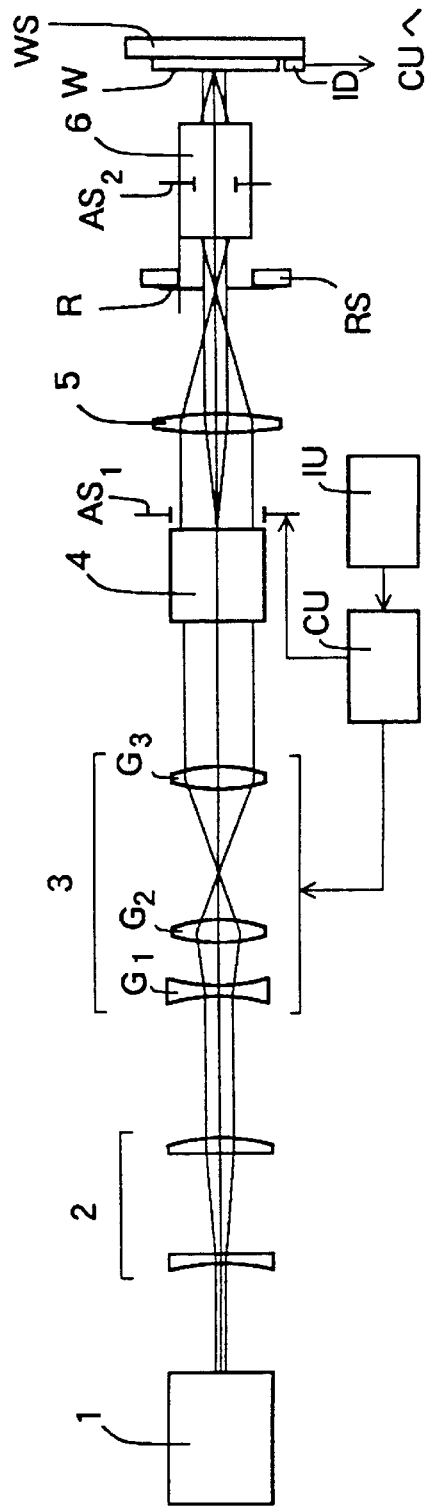

FIGS. 3(a) and 3(b) show a third embodiment of the present invention, illustrating a semiconductor device manufacturing method of the present invention. FIG. 3(a) represents a plane cross section and FIG. 3(b) represents a longitudinal cross-section. A parallel laser beam emitted from an excimer laser 1 is formed into an almost square shape by cylindrical lenses 2 and then expanded to a predetermined size by an afocal beam expander 3. The parallel beam thus expanded enters an optical integrator 4. The optical integrator 4 comprises a fly eye lens having a plurality of 10×10 to 100×100 lens elements arranged in a matrix. The optical integrator 4 causes the parallel beam to produce a virtual, planar secondary light source in a vicinity of an emitting-side lens surface of the fly eye lens. A condenser lens 5 causes a beam coming from the secondary light sources to illuminate a reticle (mask) R by means of a superposition. A projection optical system 6 transcribes a circuit pattern of the reticle R onto a wafer W.

A reticle stage RS retains the reticle R. A wafer stage WS retains the wafer W, which is usually a photosensitive substrate coated with a resist, or a photo sensitive material.

Upon completion of the exposure process (photolithographic process) by the exposure system of the third embodiment, as shown in FIGS. 3(a) and 3(b), the wafer W goes through the etching step of removing the portions other than the developed resist after the step of development, followed by the resist removal step of removing unnecessary resist from the wafer W. The wafer then goes through dicing, whereby the wafer is cut into printed circuit chips; bonding, whereby each chip is wired; and packaging, whereby each chip is packaged. The resultant product is a semiconductor device (such as a Large Scale Integrated Circuit, or LSI). This example involves manufacturing semiconductor devices using photolithography with a projection exposure system in the wafer process. The photolithography process using a projection exposure system can also produce liquid crystal display devices, thin film magnetic heads, and image pick-up devices (such as Charge Coupled Devices, or CCDs) as semiconductor devices.

In the exposure system of the third embodiment as shown in FIGS. 3(a) and 3(b), an adjustable aperture shutter $AS_1$, which makes an aperture diameter variable, is placed at the positions of numerous secondary light sources formed on the emitting side of the optical integrator 4 and in the vicinity thereof. An aperture stop $AS_2$ is placed at a pupil position of the projection optical system 6. A σ value called "coherence factor," which can be changed by varying the aperture diameter of the adjustable aperture stop $AS_1$, ensures optimal illumination suitable for each circuit pattern on the reticle R to be transcribed on the wafer W and for each exposure process. In the exposure system shown in FIGS. 3(a) and 3(b), a transfer map of the wafer W to be exposed sequentially onto the exposure surface of the projection optical system 6 allows a control unit CU to control the aperture diameter of the variable aperture $AS_1$ based on data input via an input unit IU, such as a console.

In changing the magnification of the afocal beam expander 3 of the third embodiment, as shown in FIGS. 3(a) and 3(b), at least one of the groups of lenses constituting the afocal beam expander 3 is moved along the optical axis to ensure efficient illumination suitable for the aperture diameter of the variable aperture stop $AS_1$, which is varied to change the σ value. At this time, movement of the group of lenses in the afocal beam expander 3 is controlled by the control unit CU.

Changes of the magnification of the afocal beam expander 3 of the embodiment as shown in FIGS. 3(a) and 3(b) are not limited to changes of the σ value. By changing the magnification of the afocal beam expander, it is possible to change illuminance or exposing light volume on the reticle R or the wafer W. A detector ID, which measures light amount or illuminance on the exposure surface (imaging surface) of the projection optical system, is placed at one edge of the wafer stage WS. The wafer stage WS is movable two-dimensionally along the exposure surface (imaging surface) of the projection optical system 6. Movement of the wafer stage WS is controlled by the control unit CU.

After the detector ID is set on the exposure surface of the projection optical system 6 by the control unit CU, the control unit CU detects a cumulative light amount based on detection data measured by the detector ID. The control unit CU compares the calculated cumulative light amount with the target cumulative light amount inputted beforehand by an input unit IU. If the control unit CU predicts excessive or insufficient exposure within a predetermined period of time, a driving unit (not shown), changes the magnification of the afocal beam expander 3 to an optimal magnification value.

Alternatively, based on the detection data measured by the detector ID, the control unit CU compares the data with the target illuminance input beforehand via the input unit IU. If the control unit CU determines excessive or insufficient illumination for a predetermined period of time, the driving unit changes the magnification of the afocal beam expander 3 to an optimal magnification value.

To control total illumination time (i.e. a number of laser pulses used for exposure) of the excimer laser 1 based on the cumulative light volume or the illuminance measured at the irradiated surface, the control unit CU may be designed to send a control signal to the excimer laser 1. Also, changing the magnification of the afocal beam expander 3, as described above, allows adjustment of the energy density of the laser beam entering the optical integrator 4, thereby adjusting illuminance or exposing light volume on the irradiated surface (i.e. the wafer W).

The detector ID does not have to be placed on the wafer stage WS, but may be placed on the reticle stage RS, which retains the reticle R.

As described above, the magnification of the afocal beam expander 3 is changed when the σ value is changed or when illuminance at the radiated surface is adjusted. Changes of the magnification of the focal beam expander 3 are not limited to these circumstances. For example, the cross-sectional size of a laser beam from an excimer laser varies depending on the excimer laser manufacturer. Therefore, even though selecting one of several excimer lasers with different beam diameters (optical cross-sectional areas) for the exposure system changes the diameter of a beam entering the afocal beam expander 3, the diameter of an incident beam can remain fixed by changing the magnification of the afocal beam expander 3.

As for the afocal beam expander 3, using the exposure system to achieve the semiconductor device manufacturing method of the third embodiment shown in FIG. 3, if $f_1=-100$, $f_2=100$, and $f_3=200$, the following values are obtained using the expressions (5) and (6):

$$d_1 = 50 \tag{11}$$

$$d_2 = 300 + \frac{200}{\beta} \tag{12}$$

Accordingly, $d_1$ and $d_2$ may be determined based on the expressions (11) and (12) by selecting the magnification P from the range equivalent to up to a five-fold magnification, or β=1 to 5. In this case, when changing the magnification of the afocal beam expander 3, it is preferable to move the second group of lenses $G_2$ and the third group of lenses $G_3$ along the optical axis, with the first group of lenses $G_1$ fixed, so as to vary the distance $d_1$ between the first group of lenses $G_1$ and the second group of lenses $G_2$ and the distance $d_2$ between the second group of lenses $G_2$ and the third group of lenses $G_3$.

Although the third embodiment shown in FIGS. 3(a) and 3(b) uses one optical integrator, two or more optical integrators may be used in the illumination optical system. An internal-reflection (or rod type) optical device may be used as the optical integrator 4, instead of the fly eye lens.

Use of the exposure system of the embodiment as shown in FIGS. 3(a) and 3(b) is not limited to a so-called step-and-repeat method, where each shot zone is exposed sequentially by moving the wafer stage WS for each one-time exposure of one shot on a wafer. A scanning type exposure system, which transfers the reticle stage RS and the wafer stage WS at the same time for the projection optical system 6 while exposing a reticle pattern, can be also used. In this case, if illuminance on the radiated surface has changed during scanning exposure, the illuminance on the radiated surface can be adjusted by changing the magnification of the afocal beam expander 3. In addition, this adjustment may be conducted by controlling total exposure time (the number of pulses emitted for a predetermined period of time) of the excimer laser 1.

Another embodiment of the present invention involves a so-called contact type semiconductor device manufacturing equipment, wherein the reticle R is in contact with the wafer, without using the projection optical system 6.

Another embodiment of the present invention involves a laser beam machine wherein a mask is placed instead of the reticle R and polyimide is used instead of the wafer W to transcribe a circuit pattern onto the polyimide.

The present invention provides an illumination optical system that does not reduce material life for groups of lenses even though a high-output excimer laser is used and is capable of illuminating target objects with stable illuminance for a long period of time. In particular, if this illumination optical system is applied to a projection exposure system for manufacturing semiconductor devices, it ensures stable projection and exposure of circuit patterns onto wafers for a long period of time without decreasing the throughput.

While the invention has been described in detail and with reference to specific embodiments thereof, it will be apparent to those skilled in the art that various changes and modifications can be made therein without departing from the spirit and scope thereof. Thus, it is intended that the present invention cover the modifications and variations of this invention provided they come within the scope of the appended claims and their equivalents.

What is claimed is:

1. An illumination optical system having an afocal optical system comprising:

a first group of lenses having negative refracting power;

a second group of lenses having positive refracting power and being positioned further away from a light source than the first group of lenses; and a third group of lenses having positive refracting power and being positioned further away from the light source than the second group of lenses;

wherein the afocal optical system expands a parallel beam of light emitted from the light source or converts the parallel beam of light into a parallel beam having equivalent magnification.

2. The illumination optical system of claim 1, wherein a distance from the first group of lenses to the second group of lenses is variable, and wherein a distance from the third group Of lenses to the second group of lenses is variable.

3. The illumination optical system of claim 1, wherein a magnification of the afocal optical system and a distance from the first group of lenses to the second group of lenses has a first relationship based upon focal distances of the first, second, and third groups of lenses, and the magnification of the afocal optical system and a distance from the second group of lenses to the third group of lenses has a second relationship based upon the focal distances of the first, second and third groups of lenses.

4. The illumination optical system of claim 1, wherein a magnification of the afocal optical system and a distance from a final lens surface of the first group of lenses to a first lens surface of the second group of lenses has a first relationship based upon focal distances of the first, second, and third groups of lenses, a distance from a rear-side principal plane to the final lens surface in the first group of lenses, and a distance from the first lens surface to a front-side principal plane of the second group of lenses; and wherein the magnification of the afocal optical system and a distance from a final lens surface of the second group of lenses to a first lens surface of the third group of lenses, a distance from the rear-side principal plane to the final lens surface of the second group of lenses, and a distance from the first lens surface to a front-side principal plane of the third group of lenses has a second relationship based upon the focal distances of the first, second, and third groups of lenses.

5. An illumination optical system of claim 1, wherein each of the first, second and third groups of lenses expands an incident light beam.

6. The illumination optical system of claim 1, wherein at least one group of the first, second and third groups of lenses is movable along an optical axis of the afocal optical system.

7. The illumination optical system of claim 1, further including a projection optical system positioned between a reticle and a projection surface of a photosensitive substrate.

8. The illumination optical system of claim 1, further including an optical integrator positioned between the third group of lenses and a reticle.

9. The illumination optical system of claim 1, further including an excimer laser as a light source.

10. An illumination optical system having an afocal optical system comprising:

a first group of lenses having positive refracting power;

a second group of lenses having positive refracting power and being positioned further away from a light source than the first group of lenses; and a third group of lenses having negative refracting power and being positioned further away from the light source than the second group of lenses;

wherein the afocal optical system amplifies a parallel beam of light emitted from the light source or converts the parallel beam of light into a parallel beam having equivalent magnification.

11. The illumination optical system of claim 10, wherein a distance from the first group Of lenses to the second group of lenses is variable, and wherein a distance from the third group of lenses to the second group of lenses is variable.

12. The illumination optical system of claim 10, wherein a magnification of the afocal optical system and a distance from the first group of lenses to the second group of lenses has a first relationship based upon focal distances of the first, second, and third groups of lenses, and the magnification of the afocal optical system and a distance from the second group of lenses to the third group of lenses has a second relationship based upon the focal distances of the first, second, and third groups of lenses.

13. The illumination optical system of claim 10, wherein a magnification of the afocal optical system and a distance from a final lens surface of the first group of lenses to a first lens surface of the second group of lenses has a first relationship based upon focal distances of the first, second, and third groups of lenses, a distance from a rear-side principal plane to the final lens surface in the first group of lenses, and a distance from the first lens surface to a front-side principal plane of the second group of lenses; and wherein the magnification of the afocal optical system and a distance from a final lens surface of the second group of lenses to a first lens surface of the third group of lenses has a second relationship based upon the focal distances of the first, second, and third groups of lenses, a distance from the rear-side principal plane to the final lens surface of the second group of lenses, and a distance from the first lens surface to a front-side principal plane of the third group of lenses.

14. An illumination optical system of claim 10, wherein each of the first, second and third groups of lenses expands an incident light beam.

15. The illumination optical system of claim 10, wherein at least one group of the first, second and third groups of lenses is movable along an optical axis of the afocal optical system.

16. The illumination optical system of claim 10, further including a projection optical system positioned between a reticle and a projection surface.

17. The illumination optical system of claim 10, further including an optical integrator positioned between the third group of lenses and a reticle.

18. The illumination optical system of claim 10, further including an excimer laser as a light source.

19. A method of manufacturing a semiconductor device comprising the steps of:

illuminating a reticle by means of an illumination optical system having an afocal optical system comprising a first group of lenses having negative refracting power, a second group of lenses having positive refracting power and being positioned further away from a light source than the first group of lenses, and a third group of lenses having positive refracting power and being positioned further away from the light source than the second group of lenses, wherein the afocal optical system amplifies a parallel beam of light emitted from the light source or converts the parallel beam of light into a parallel beam having equivalent magnification; and forming a pattern of the reticle onto a photosensitive substrate.

20. The method of claim 19, wherein the step of illuminating a reticle further includes changing a cross-section of an incident light beam using the first, second and third groups of lenses.

21. The method of claim 19, wherein the step of illuminating a reticle further includes moving at least one group of the first, second and third groups of lenses along an optical axis of the afocal optical system.

22. The method of claim 19, wherein the step of imaging a pattern from the reticle onto a wafer further includes an optional step of changing a cross-section of an incident light beam by moving at least one of the first, second and third groups of lenses.

23. The method of claim 19, wherein the step of illuminating a reticle further includes an optional step of adjusting distances from the first group of lenses to the-second group of lenses, or from the second group of lenses to the third group of lenses.

24. The method of claim 19, wherein the step of illuminating a reticle further includes a step of adjusting a first relationship between a magnification of the afocal optical system and a distance from the first group of lenses to the second group of lenses based upon focal distances of the first, second, and third groups of lenses, and adjusting a second relationship between the magnification of the afocal optical system and a distance from the second group of lenses to the third group of lenses based upon the focal distances of the first, second, and third groups of lenses.

25. The method of claim 19, wherein the step of illuminating a reticle further includes a step of adjusting a first relationship between a magnification of the afocal optical system and a distance from a final lens surface of the first group of lenses to a first lens surface of the second group of lenses based upon focal distances of the first, second, and third groups of lenses, a distance from a rear-side principal plane to the final lens surface in the first group of lenses, and a distance from the first lens surface to a front-side principal plane of the second group of lenses; and wherein the step of illuminating a reticle further includes a step of adjusting a second relationship between the magnification of the afocal optical system and a distance from a final lens surface of the second group of lenses to a first lens surface of the third group of lenses based upon the focal distances of the first, second, and third groups of lenses, a distance from the rear-side principal plane to the final lens surface of the second group of lenses, and a distance from the first lens surface to a front-side principal plane of the third group of lenses.

26. The method of claim 19, wherein the step of illuminating a reticle uses an excimer laser.

27. A method for manufacturing a semiconductor device, comprising the steps of:

illuminating a reticle with an illumination optical system having an afocal optical system comprising a first group of lenses having positive refracting power, a second group of lenses having positive refracting power and positioned further away from a light source than the first group of lenses, and a third group of lenses having negative refracting power and positioned further away from the light source than the second group of lenses, wherein the afocal optical system expands a parallel beam of light emitted from the light source or converts the parallel beam of light into a parallel beam of light having equivalent magnification; and forming a pattern corresponding to the reticle on a photosensitive substrate.

28. An illumination optical system, comprising:

a light source emitting a first beam of light having a first cross-sectional area; and a beam reshaping optical system for converting the first beam of light into a second beam of light having a second cross-sectional area;

wherein the beam reshaping optical system comprises a plurality of groups of lenses arranged to form the second beam, wherein each of the plurality of groups of lenses is positioned in a beam of light having a cross-sectional area larger than the first cross-sectional area.

29. The illumination optical system of claim 28, further including a projection optical system positioned between a reticle and a photosensitive substrate, wherein the reticle is illuminated by the second beam of light.

30. The illumination optical system of claim 28, wherein a least one of the plurality of groups of lenses is movable along an optical axis of the beam reshaping optical system to make a magnification of the beam reshaping optical system variable and is positioned in a beam of light having a cross-sectional area larger than the first cross-sectional area of the first beam of light entering the beam reshaping optical system while the magnification of the beam reshaping optical system is varied.

31. The illumination optical system of claim 30, further including a projection optical system positioned between a reticle and a photosensitive substrate, wherein the reticle is illuminated by the second beam of light.

32. A method for manufacturing a semiconductor device by using an illumination optical system having a light source emitting a first beam of light having a first cross-sectional area, and a beam reshaping optical system for converting the first beam of light into a second beam of light having a second cross-sectional area, wherein the beam reshaping optical system includes a plurality of groups of lenses arranged to form the second beam, and wherein each of the plurality of groups of lenses is positioned in a beam of light having a cross-sectional area larger than the first cross-sectional area, comprising the steps of:

illuminating a reticle having a predetermined pattern with the second beam of light from the illumination optical system; and exposing the predetermined pattern onto a photosensitive substrate.

33. A method for manufacturing a semiconductor device by using an illumination optical system having a light source emitting a first beam of light having a first cross-sectional area, a beam reshaping optical system for converting the first beam of light into a second beam of light having a second cross-sectional area, and a projection optical system positioned between a reticle and a photosensitive substrate, wherein the beam reshaping optical system includes a plurality of groups of lenses arranged to form the second beam, and wherein each of the plurality of groups of lenses is positioned in a beam of light having a cross-sectional area larger than the first cross-sectional area, comprising the steps of:

illuminating a reticle having a predetermined pattern with the second beam of light from the illumination optical system; and exposing the predetermined pattern onto a photosensitive substrate through the projection optical system.

34. A method for manufacturing a semiconductor device by using an illumination optical system having a light source emitting a first beam of light having a first cross-sectional area, and a beam reshaping optical system for converting the first beam of light into a second beam of light having a second cross-sectional area, wherein the beam reshaping optical system includes a plurality of groups of lenses arranged to form the second beam, wherein at least one of the plurality of groups of lenses is movable along an optical axis of the beam reshaping optical system to make a magnification of the beam reshaping optical system variable and is positioned in a beam of light having a cross-sectional area larger than the first cross-sectional area of the first beam of light entering the beam reshaping optical system while the magnification of the beam reshaping optical system is varied, comprising the steps of:

illuminating a reticle having a predetermined pattern with the second beam of light from the illumination optical system; and exposing the predetermined pattern onto a photosensitive substrate.

35. A method for manufacturing a semiconductor device by using an illumination optical system having a light source emitting a first beam of light having a first cross-sectional area, and a beam reshaping optical system for converting the first beam of light into a second beam of light having a second cross-sectional area, wherein the beam reshaping optical system includes a plurality of groups of lenses arranged to form the second beam, wherein at least one of the plurality of groups of lenses is movable along an optical axis of the beam reshaping optical system to make a magnification of the beam reshaping optical system variable and is positioned in a beam of light having a cross-sectional area larger than the first cross-sectional area of the first beam of light entering the beam reshaping optical system while the magnification of the beam reshaping optical system is varied, wherein a projection optical system is positioned between a reticle and a photosensitive substrate, and wherein the reticle is illuminated by the second beam of light, comprising the steps of:

illuminating a reticle having a predetermined pattern with the second beam of light from the illumination optical system; and exposing the predetermined pattern onto a photosensitive substrate through the projection optical system.

\* \* \* \* \*